United States Patent
Berberich et al.

(10) Patent No.: US 7,738,226 B2
(45) Date of Patent: Jun. 15, 2010

(54) INTEGRATED SNUBBER DEVICE ON A SEMICONDUCTOR BASIS FOR SWITCHING LOAD REDUCTION, VOLTAGE LIMITATION AND/OR OSCILLATION ATTENUATION

(75) Inventors: Sven Berberich, Spardorf (DE); Martin Maerz, Nürnberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 555 days.

(21) Appl. No.: 11/695,726

(22) Filed: Apr. 3, 2007

(65) Prior Publication Data
US 2007/0274014 A1 Nov. 29, 2007

(30) Foreign Application Priority Data
Apr. 13, 2006 (DE) .................. 10 2006 017 487

(51) Int. Cl.
 H02H 3/20 (2006.01)
 H02H 9/04 (2006.01)
 H01L 27/06 (2006.01)
(52) U.S. Cl. .................. 361/91.7; 257/533; 257/535; 257/537
(58) Field of Classification Search .................. 361/91.7
See application file for complete search history.

(56) References Cited

U.S. PATENT DOCUMENTS

| 4,697,219 | A | | 9/1987 | Mitsuoka |
| 5,770,886 | A | * | 6/1998 | Rao et al. .................. 257/533 |
| 7,190,564 | B2 | * | 3/2007 | Yunus .................. 361/91.7 |
| 2002/0125548 | A1 | | 9/2002 | Nagasu et al. |
| 2006/0003522 | A1 | * | 1/2006 | Lin et al. .................. 438/238 |

FOREIGN PATENT DOCUMENTS

| EP | 0 066 721 | 12/1982 |
| EP | 0 172 338 | 2/1986 |
| EP | 0 971 412 | 1/2000 |
| EP | 1 039 547 | 9/2000 |
| EP | 1 231 825 | 8/2002 |
| GB | 2 283 376 | 5/1995 |
| JP | 57204164 | 12/1982 |
| JP | 60074679 | 4/1985 |
| WO | WO 94/18687 | 8/1994 |

OTHER PUBLICATIONS

English language translation of abstract of JP 60074679, Publication Date: Apr. 26, 1985.
English language translation of abstract of JP 57204164, Publication Date: Dec. 14, 1982.
D. Widmann, H. Mader, and H. Friedrich; "Technologie hochintergrierter Schaltungen;" ISBN 3-540-59357-8; p. 273, table 8.3, Mar. 2005.

* cited by examiner

*Primary Examiner*—Jared J Fureman
*Assistant Examiner*—Dharti H Patel
(74) *Attorney, Agent, or Firm*—Thomas, Kayden, Horstemeyer & Risley

(57) ABSTRACT

Integrated snubber device on a semiconductor basis for wiring an electric network for absorbing electric energy from an electric energy store, of an electric network, including at least two terminals for being connected to the electric network to be wired, an electric resistor structure, and a reactance structure, which are connected between the terminals.

13 Claims, 7 Drawing Sheets

INTEGRATED SNUBBER DEVICE ON A SEMICONDUCTOR BASIS FOR SWITCHING LOAD REDUCTION, VOLTAGE LIMITATION AND/OR OSCILLATION ATTENUATION

CROSS-REFERENCE TO RELATED APPLICATION

This application claims priority from German Patent Application No. 102006017487.9, which was filed on Apr. 13, 2006, and is incorporated herein by reference in its entirety.

BACKGROUND OF THE INVENTION

1. Field of the Invention

The present invention-relates to the wiring, or connecting, of electric networks for switching load reduction, voltage limitation and/or oscillation attenuation, in particular to the utilization of monolithically integrated snubber devices for the above-mentioned purposes in power electronics and high-frequency engineering.

2. Description of Prior Art

In electronic circuits, with each switching operation there is a risk of exciting parasitic oscillations. This is intended to mean oscillations within resonant circuits formed from undesired electric energy stores, i.e. parasitic inductances and capacitances. In real devices and assembly techniques, these parasitic elements are, in principle, inevitable. Examples thereof are the self-capacitances of semiconductor devices, the line inductances of electric connections, or the leakage inductances and winding capacitances of transformers.

Excitation of parasitic resonant circuits is effected by edges within the currents or voltages of a circuit. The resulting oscillations form a source for electromagnetic interference, which may lead to malfunctions within electronic circuits, and which significantly complicate compliance with the relevant EMV norms as high-energy narrow-band interferers. To reduce the amplitudes of parasitic oscillations, what is required is either to reduce the slope of the exciting current or voltage edges, and/or to increase the attenuation of the causal parasitic resonant circuit.

FIG. 1a shows, by way of example, a series resonant circuit consisting of the elements L, C, and of an attenuation resistor R. FIG. 1b describes the step response of this resonant circuit for different attenuations. For values of attenuation D within the range from 0.5-1, an optimum switching edge with a high level of steepness and, at the same time, with no or only little overshoot is achieved.

In real circuits it is generally not justifiable, for reasons of power dissipation, connecting the attenuation resistor immediately in parallel with a component of the parasitic resonant circuit. FIG. 2 shows a network to be wired which comprises a voltage source 200 providing a voltage $V_{in}$, a MOSFET 202 and a parasitic line inductance L. The MOSFET additionally comprises a parasitic capacitance C depicted as a separate element. It represents an energy store to be wired with a snubber network, exemplary wiring topologies being shown by networks A, B, and C in FIG. 2. If, for example, an attenuation resistor were connected in parallel with parasitic capacitance C formed by the drain-source capacitance of power MOSFET 202 (FIG. 2), what would permanently arise in the attenuation resistor, with the MOSFET switched off, is a power dissipation proportional to the square of the drain-source voltage $V_{DS}$.

However, for the attenuation action desired it is generally sufficient to allow the attenuation resistor to become active within the area of the switching edge only, and to decouple it from the circuit in a stationary manner. This may be achieved, as is depicted in attenuation network A in FIG. 2, by a coupling capacitor $C_1$ in series with resistor $R_1$. This coupling capacitor is preferably dimensioned such that its impedance, with the oscillation frequency to be attenuated, roughly corresponds to ½ to ½π of the value of attenuation resistor $R_1$.

But even with a coupling capacitor, power dissipation will arise in the attenuation resistor, the power dissipation roughly corresponding to the energy stored within the parasitic resonant circuit, multiplied by the switching frequency. It is this energy withdrawal that the mode of operation of the attenuation resistor is based on. The respective power dissipation is therefore inevitable, and in real applications it may take on substantial values and require effective cooling of the resistor.

A further critical point is that the resistor can only perform its function if coupling to the resonant circuit to be attenuated is performed at an extremely low inductance. Otherwise, the parasitic inductance of the feed line will decouple the attenuation resistor from the resonant circuit to be attenuated precisely during the switching edge, and thus will considerably reduce the effect of the attenuator.

What has been described results in requirements placed upon the attenuation network A consisting of resistor $R_1$ and coupling capacitor $C_1$. The resistance of $R_1$ should be adjustable to the characteristic impedance $Z_0$ of the parasitic LC resonant circuit to be attenuated (for an optimum attenuation behavior), and may range between 0.5 Ω and 100 Ω. The resistor should be effectively coolable. The attenuation network should comprise a low-inductance structure and a high level of pulse handling capability. In addition, there should be compatibility, in terms of assembly techniques, with the circuit to be attenuated (e.g. power module) for simple assembly with extremely small parasitic connection inductances.

In addition to purely attenuating a parasitic resonant circuit, a further possibility of reducing the amplitudes of parasitic oscillations is to reduce the slope of the exciting current or voltage edge. This is possible, for example, with a so-called dV/dt limiter such as network B in FIG. 2. Network B comprises a capacitance $C_2$ in series with a resistor $R_2$, and a diode $D_2$ connected in parallel with resistor $R_2$. Such a network is also very frequently used for protecting devices of limited dV/dt stabilities, such as thyristors, triacs or GTOs.

During the positive voltage edge (here, during the drain-source voltage), diode $D_2$ places capacitor $C_2$ directly in parallel with the circuit element at which the dV/dt limitation is to be effected. The process of charging $C_2$ immediately results in the desired limitation of the slope of the positive voltage edge. Resetting the voltage at $C_2$, i.e. discharging $C_2$, is performed during the ON phase of the switch via discharging resistor $R_2$, which may range between 10 Ω and 500 Ω. Diode $D_2$ and capacitor $C_2$ are exposed to very high peak loads. During the phase of the voltage increase, virtually the entire load current from the device switching off (here the MOSFET) commutes to these two elements of the dV/dt limiter.

A third, very frequently used wiring is the voltage limiter in accordance with FIG. 2, network C. Network C comprises a resistor R3 in parallel with a capacitance $C_3$, the parallel connection of $R_3$ and $C_3$ being serially connected to a diode $D_3$.

If the voltage present at the device to be protected (here, MOSFET 202) exceeds the voltage present at capacitor $C_3$, diode $D_3$ will clamp the voltage (VDS) to the value of the voltage present at $C_3$. Unlike networks A and B, with network C the capacitance of $C_3$ is typically selected to be so large that the voltage present at this capacitor will only slightly change due to the energy to be clamped in a switching operation.

Between two switching operations, resistor $R_3$ sees to the conversion of the energy supplied per clamping operation to heat, and it may range between 500 Ω and 10 kΩ. Thus, the means voltage present at $C_3$ results from a balance between the energy supplied and the energy converted to heat within $R_3$.

For a high level of efficiency, in networks B and C, the current path from the terminals of the network across the diode and the capacitance must be configured to be particularly low in inductance (whereas the current path via the resistor is uncritical, specifically within network C).

In principle, snubber networks for switching load reduction, or for limiting the stress on the switch, voltage limitation and/or oscillation attenuation, referred to as so-called snubber networks, may be divided up into passive and active networks. Passive networks consist of passive devices (resistors, capacitances, inductances and diodes), and active networks additionally contain one or several active switches (e.g. MOS devices). A special case are networks comprising non-linear devices such as Z diodes, varistors, actively clamped switches, or current limiters which limit voltages or currents in accordance with their characteristic curves.

Snubber networks withdraw energy from parasitic reactances of an electronic circuit. Depending on whether this energy is converted to heat or is fed back into the circuit, one differentiates between dissipative and regenerative snubber networks. To attenuate parasitic oscillations, use is made virtually exclusively of dissipative snubber networks. Networks A, B and C of FIG. 2 work in a dissipative manner.

In accordance with the prior art, snubber networks for power electronics are constructed from discrete devices. Integrated solutions for applications in the voltage range of up to several hundred volts and for peak currents of up to several hundred amperes have not hitherto been known. Integrated networks, e.g. on the basis of thick-film or LTCC technologies, have been available only for filtering signal lines. In discretely structured snubber networks, what is predominantly utilized are foil and ceramic capacitors, due to the high demands placed upon the alternating-current handling capability. The electric series resistance of a ceramic capacitor is typically not sufficient for using the capacitor as a snubber device. Even if the series resistance were increased, the resulting device would be difficult to cool due to its high thermal resistance, and thus it would be poorly suited as a snubber device. RC attenuators structured in accordance with network A in FIG. 2 place particularly high demands upon the resistor. To this end, low-inductance metal film resistors are employed, in the high performance range, composition resistors are also employed. Even with power losses of a few watts in the resistor, a sufficiently low-inductance architecture of the network cannot be realized, in accordance with the prior art, due to the spatial expansion of the individual devices and to the necessity of cooling. In view of the increasingly steep current and voltage edges in modern power-electronic systems, this represents a considerable problem.

The requirements placed upon an extremely low self-inductance of the snubber networks are increasingly difficult to meet, with increasing levels of power, due to the spatial expansion of classical devices such as capacitors, power diodes, and power resistors, as well as due to the cooling required.

SUMMARY OF THE INVENTION

It is the object of the present invention to provide a possibility by means of which even modern power-electronic systems may be wired at low expenditure so as to achieve switching load reduction, voltage limitation and/or oscillation attenuation.

In accordance with a first aspect, the present invention provides an integrated snubber device on a semiconductor basis for wiring an electric network for absorbing electric energy from an electric energy store of an electric network, including:

at least two terminals for connecting to the electric network to be wired, an electric resistor structure and a reactance structure which are connected between the terminals.

In accordance with a second aspect, the present invention provides a use of an integrated snubber device on a semiconductor basis for wiring an electric network for absorbing electric energy from an electric energy store of an electric network, the device including:

at least two terminals for connecting to the electric network to be wired, an electric resistor structure and a reactance structure which are connected between the terminals;

for wiring an electric network for absorbing electric energy from an electric energy store of the electric network, to achieve switching load reduction, voltage limitation, and/or oscillation attenuation of the electric network.

The findings of the present invention consist in that an extremely low-inductance architecture, particularly effective coolability and compatibility, in terms of assembly technology, with power semiconductor chips is achieved by monolithically integrating a snubber network into a chip. Thus, completely novel integrated snubber devices result. A very compact device results which includes all individual elements of the respective snubber network, and which is compatible, in terms of assembly technology, with power semiconductors, so that it may be effectively cooled and may be connected, at low inductance, in parallel with power semiconductor chips, like a power semiconductor chip. Inventive capacitive or inductive structures may be provided as the reactance structures.

In preferred embodiments, the integrated snubber device comprises a series connection consisting of resistor and capacitance, a parallel connection consisting of resistor and capacitance, and serially therewith a diode, or a parallel connection consisting of resistor and diode and, in series therewith a capacitance. A capacitor realizing the capacitance is preferably integrated into the element in that an electrode of same is configured as a semiconductor area which is connected to a terminal either directly or via at least one semiconductor area. A resistance of the resistor structure may then preferably be set via the doping of the semiconductor area representing the electrode of the capacitance. Typical doping concentrations for this purpose may range from $10^{13}$ cm$^{-3}$ to $10^{19}$ cm$^{-3}$.

A snubber network in the form of one single device may additionally reduce the assembly cost and—due to the reduced number of connection points—even increase the system reliability. A snubber network containing the above-described elements and exhibiting small space requirements may in addition also be advantageous for applications at an IC level, e.g. in smart power chips.

An inventive integrated snubber device exhibits considerable advantages as compared to the prior art. It represents a high-temperature capacitor with excellent device properties having an integrated series resistance which may be accurately set. It offers the degrees of freedom of being able to integrate further components of a snubber network or to discretely supplement them. It may even be introduced as a module into a manufacturing process of a smart power circuit.

By using semiconductor technology it is possible to achieve an expansion of the area, and thus of the capacitance, of the snubber capacitors per substrate floor space. This and the use of high-epsilon dielectrics enables a clear reduction of manufacturing cost as compared to conventional semiconductor devices.

For many cases of application (e.g. in power modules) it is necessary for the snubber elements to be still operable even at temperatures clearly above 100° C. Currently, it is almost exclusively ceramic capacitors that are used in this temperature range. The common ceramics such as X7R, Z5U or Y5V lead to considerable voltage and temperature dependencies of the capacitance values, it being possible for changes by up to 70% and more to occur in the capacitance during operation.

Inventive snubber devices comprising a capacitor integrated into silicon, by contrast, exhibit superior temperature stability and a broad range of application temperatures. The temperature dependence of the capacitance value, related to the value at 25° C., is only about 20 ppm/° C. Due to the high admissible permanent-use temperatures of typically 175° C. (snubber devices with diode structures) or 200° C. (for passive RC networks), combined with the high stability of the capacitance value and the superior thermal rating for an extremely small design volume, the inventively integrated snubber devices are far superior to existing solutions.

In addition to their superior thermal properties and their superior properties in terms of high-frequency engineering, the inventive snubber devices also offer users savings in terms of space, weight and cost, reduced assembly requirements and increased system reliability because of the solder connections being omitted. Thus, for the first time, snubber devices which meet all requirements placed upon such devices in a superior manner are available for the high performance range as well.

BRIEF DESCRIPTION OF THE DRAWINGS

These and other objects and features of the present invention will become clear from the following description taken in conjunction with the accompanying drawing, in which:

FIG. 3b shows an attenuation network implemented by a snubber device of FIG. 3a;

FIG. 4b shows an attenuation network implemented by a snubber device of FIG. 4a;

FIG. 5b shows a voltage limiter network implemented by a snubber device of FIG. 5a;

DESCRIPTION OF PREFERRED EMBODIMENTS

Figure 3A:
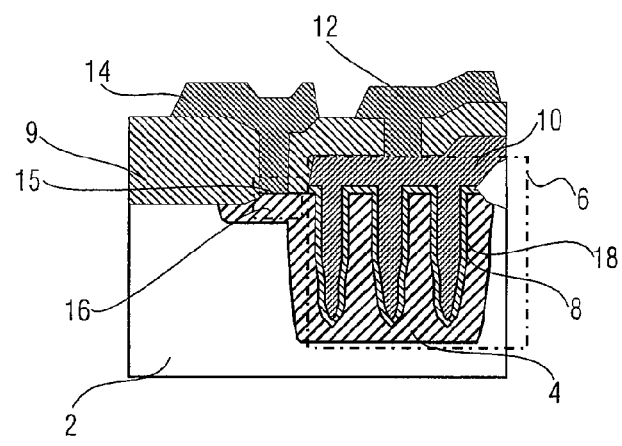
FIG. 3a is a schematic representation of an embodiment of an inventive snubber device.
Figure 3B:
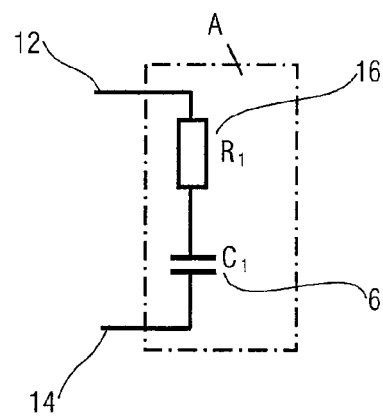

FIG. 3a shows a cross-sectional view of an inventive embodiment of the integrated snubber device which implements an attenuation network as is shown in FIG. 3b. The integrated snubber device comprises a semiconductor chip 2 having a semiconductor area 4 defined therein which represents a bottom electrode of a capacitor structure 6. Capacitor structure 6 further includes a dielectric layer 8 and a top electrode 10, the dielectric layer 8 being sandwiched between the top electrode 10 and the substrate area 4. The top electrode 10 is conductively connected to a first contact 12, and substrate area 4 is conductively connected to a second contact 14. Besides, contacts 12 and 14 are isolated from substrate 2 by an isolating layer 9. A resistor structure 16 is formed between capacitor area 6 and terminal 14 by semiconductor area 4.

In this embodiment, a contact 12 for the top electrode, and contact 14 for the bottom electrode of the capacitor structure are located on the top face of the chip. The RC attenuation network consists of a capacitor 6 and a resistor 16 connected in series. The latter is defined by the doping of semiconductor area 4 and the structure of the contact geometry. The resistance may be set to almost any value by an altered doping and/or by varying the thickness of the substrate material. Integration into a semiconductor chip results in an excellent temperature behavior.

In an embodiment, not shown, of an inventive integrated snubber device, the resistor structure may also be created by means of additional conductive traces (e.g. of doped polysilicon or metal) between semiconductor area 4 and contact 14, or between a feed line and contact 12. The resistance may then be set to any value via the width, thickness and/or doping of the conductive traces.

Figure 4A:
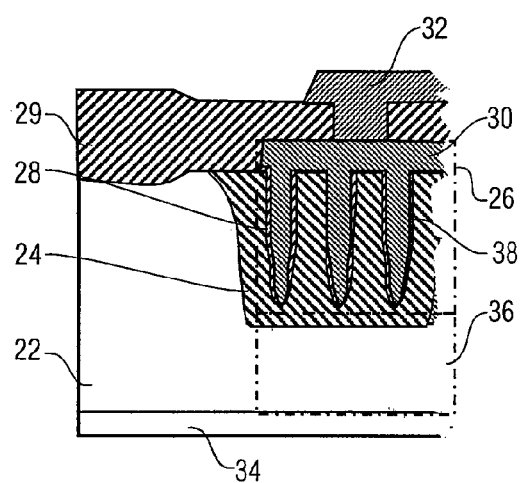
FIG. 4a is a schematic representation of a further embodiment of an inventive snubber device.
Figure 4B:
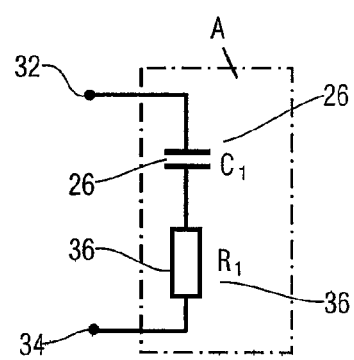

FIG. 4a shows a cross-sectional view of a further, particularly advantageous inventive embodiment of an integrated snubber device implementing an attenuation network as is depicted in FIG. 4b. The integrated snubber device includes a semiconductor chip 22 having a semiconductor area 24 defined therein which represents a bottom electrode of a capacitor structure 26. The capacitor structure 26 further comprises a dielectric layer 28 and a top electrode 30, the dielectric layer 28 being sandwiched between the top electrode 30 and the substrate area 24. Top electrode 30 is conductively connected to a first contact 32, and substrate area 22 is conductively connected to a second contact 34. A resistor structure 36 is formed between capacitor area 26 and terminal 34 by the semiconductor areas 22, 24 between terminal 34 and capacitor area 26. Semiconductor area 24, which acts as the bottom electrode of the capacitor, will typically be more highly doped than the substrate.

In this embodiment of the inventive snubber device, a contact 32 of the top electrode is located on the top face of the chip, and a contact 34 of the bottom electrode is located on the bottom face of the chip. The resistor structure 36 configured across a large area results in a highly resilient device having superior thermal properties. The resistance of resistor structure 36 is essentially defined by the surface areas of the contact areas between semiconductor area 24, substrate area 22, and contact 34, the doping of semiconductor area 24, and the thickness and doping of substrate area 22 between semiconductor area 24 and contact 34.

The devices of FIG. 3a and 4a are monolithically integrated into a semiconductor. They consist of a capacitor structure 6, 26 and a resistor 16, 36 connected in series. The capacitor consists of top 10, 30, and bottom 4, 24 electrode, respectively. A dielectric 8, 28 is located between the two electrodes. The semiconductor material is structured by means of preferably anisotropic etching processes (e.g. dry etching or wet chemical), whereby its surface area may be enlarged many times over. The structures are preferably hole geometries, but column geometries or strip/trench geometries or other geometries which enlarge the surface are also possible. The above-described structured semiconductor surface 18, 38 serves as a base area for the capacitor, the structure of which is performed on this surface.

With regard to further embodiments, the bottom electrode 4, 24 may either be the substrate having a certain specific conductivity, or the substrate may be modulated in its conductivity by additional doping. The resistances typical of such attenuation networks which range from several hundred milliohms up to several ten ohms may be realized extremely well in this manner. The bottom electrode 4, 24, however, may also consist of an additional layer having a different specific conductivity. Dielectric 8, 28 is obtained from the substrate either by means of oxidation, or an additional layer having dielectric properties is deposited onto or applied to bottom electrode 4, 24. Top electrode 10, 30 consists of a further layer having a specific conductivity. The two electrodes are contacted with a current-conductive material (preferably a metallic layer or a doped polysilicon), and this corresponds to the contacts 12, 32 and 14, 34 described at the beginning of the paragraph.

Semiconductor technology enables structuring of the substrate and thus enlargement of the chip surface area. This enlargement, as well as the possibility of employing materials having high dielectric constants (so-called high-epsilon materials) as the dielectric 8, 28 substantially reduce the manufacturing cost of the inventive snubber devices. In addition, it is possible to integrate the inventively integrated snubber networks also into smart power circuits or into power semiconductor chips.

An inventive device may contain further elements of a snubber network (such as diodes or resistors) in a monolithically integrated condition.

Figure 5A:
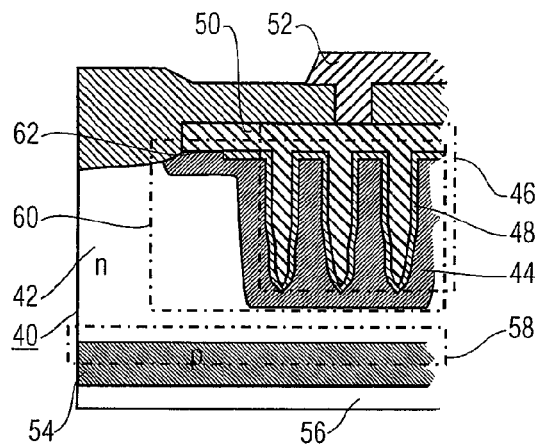
FIG. 5a is a schematic representation of a further embodiment of an inventive snubber device.
Figure 5B:
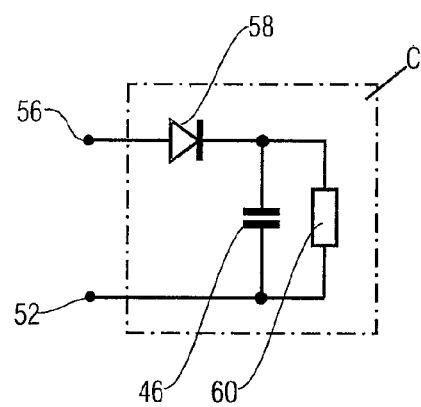

FIG. 5a shows a cross-sectional view of a further inventive embodiment of an integrated snubber device implementing a voltage limiter network as is depicted in FIG. 5b. The integrated snubber device includes a semiconductor chip 40 having an n-doped semiconductor area 42 formed therein. The n-doped substrate area 42 comprises a second semiconductor area 44 which will typically be more highly doped than area 42, and which represents a bottom electrode of a capacitor structure 46. Capacitor structure 46 further comprises a dielectric layer 48 and a top electrode 50, the dielectric layer 48 being arranged between top electrode 50 and substrate area 44. Top electrode 50 is conductively connected to a first contact 52 and to semiconductor area 44. A p-doped substrate area 54 is conductively connected to a second contact 56. A pn diode structure 58 is defined by the p-doped substrate area 54 and the n-doped area 42. Semiconductor area 44 defines a resistor area 60 which represents a resistor connected in parallel with capacitor structure 46.

In accordance with FIG. 5a, the series connection of capacitor 46 and diode 58 is realized in that the diode is vertically integrated, i.e. is connected upstream from capacitor 46. Resistor 60 connected in parallel with the capacitor is defined via an ohmic contact 62 on the top side of the substrate, the substrate doping and/or the doping of area 44, and the active surfaces.

Further embodiments of an inventive snubber device result from a lateral series connection of a pn junction or a pin structure, and a capacitor structure. Another possibility of realizing the resistor is offered by using dielectric layers allowing high leakage currents. Typically, this is the case with so-called high-epsilon layers. It thus becomes possible to achieve a large-surface area resistor having a low thermal resistance, which leads to a device which is loadable to a considerably higher extent than would be the case if, e.g., only the edge structure of the capacitor field were conductive. To this end, it is advantageous to specifically render the dielectric conductive so as to reduce the temperature dependence of the resistance. In addition, the resistor arranged in parallel with the capacitor could be realized by means of so-called vias, i.e. through-connections, which extend through the entire thickness of the substrate.

Figure 6A:
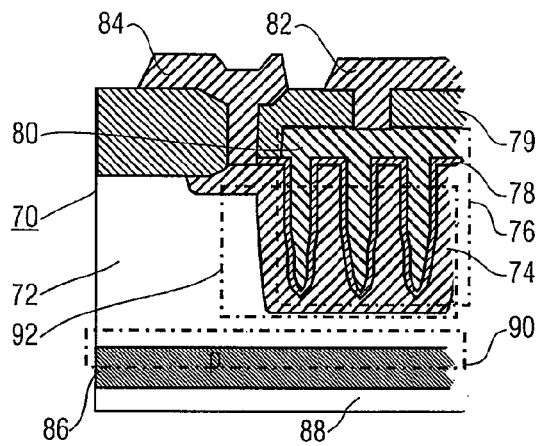
FIGS. 6a and 6b show schematic representations of further embodiments of an inventive snubber device.
Figure 6B:
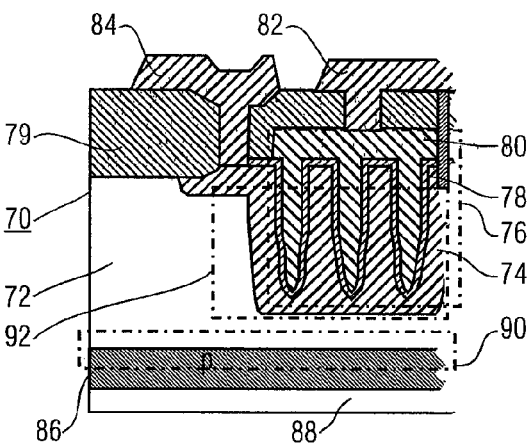
Figure 6C:
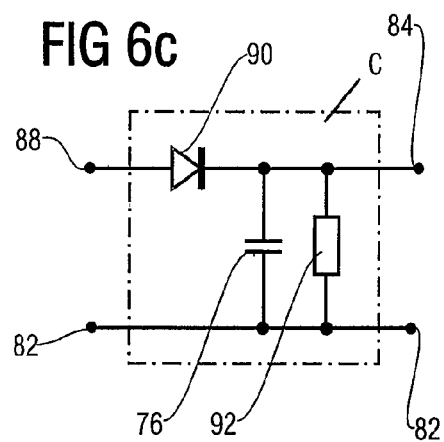
FIG. 6c shows a voltage limiter network implemented thereby.

FIG. 6a shows a cross-sectional view of a further inventive embodiment of an integrated snubber device which implements a voltage limiter network as is depicted in FIG. 6c. The integrated snubber device comprises a semiconductor chip 70 having an n-doped semiconductor area 72 defined therein. The n-doped substrate area 72 comprises a semiconductor area 74 representing a bottom electrode of a capacitor structure 76. Capacitor structure 76 further comprises a dielectric layer 78 and a top electrode 80, the dielectric layer 78 being arranged between top electrode 80 and substrate area 74. Top electrode 80 is conductively connected to a first contact 82, and substrate area 74 is conductively connected to a second contact 84. Besides, contacts 82 and 84 are isolated from substrate 72 by an isolating layer 79. A p-doped substrate area 86 is conductively connected to a second contact 88. A pn diode structure 90 is defined by the contact area between the p-doped substrate area 86 and the n-doped substrate area 72. In the embodiment shown in FIG. 6a, resistor 92 of the parallel connection, depicted in FIG. 6c, of capacitance 76 and resistor 92 is formed by the contact area between top electrode 80, dielectric layer 78, and semiconductor area 74. In the embodiment depicted in FIG. 6a, use is made of a dielectric exhibiting low conductivity, as is the case, for example, with high-epsilon layers, so that same represents a parallel resistor in addition to a capacitance, so that the resistance of the resistor 92 connected between terminals 82 and 84 is essentially determined by this property of dielectric 80.

A further embodiment in accordance with the present invention is depicted in FIG. 6b, which also shows a snubber device realizing a voltage limiter network as is shown in FIG. 6c. The integrated snubber device includes a semiconductor chip 70 having an n-doped semiconductor area 72 defined therein. The n-doped substrate area 72 comprises a semiconductor area 74 representing a bottom electrode of a capacitor structure 76. Capacitor structure 76 further comprises a dielectric layer 78 and a top electrode 80, the dielectric layer 78 being arranged between top electrode 80 and substrate area 74. A first contact 82 is conductively connected to top electrode 80 and to semiconductor area 74. In addition, substrate area 74 is conductively connected to a second contact 84. Contacts 82 and 84 are incidentally isolated from substrate 72 by an isolating layer 79. A p-doped substrate area 86 is conductively connected to a second contact 88. A pn diode structure 90 is defined by the contact area between the p-doped substrate area 86 and the n-doped substrate area 72. In the embodiment shown in FIG. 6b, resistor 92 of the parallel connection, depicted in FIG. 6c, of capacitance 76 and resistor 92 is formed by semiconductor area 72. This means that the resistance of resistor 92 connected between terminals 82 and 84 is determined by the doping of semiconductor area 74.

In the two embodiments mentioned last, the inventive snubber device is realized as a triple pole. This is advantageous when individual elements of the switching networks have no specific dynamic demands placed upon them, such as $R_3$ in network C of FIG. 2, and/or when a possibility of adapting the properties of the snubber network to the application requirements is to be provided (reducing the variety of variants). Using the embodiments depicted in FIGS. 6a,b it is possible to supplement external snubber elements, e.g. a further resistor, capacitor or a Z diode. By wiring, or connecting, with an external resistor between terminals 82 and 84, for example, the clamping voltage level may be adjusted to the respective application.

Figure 7A:
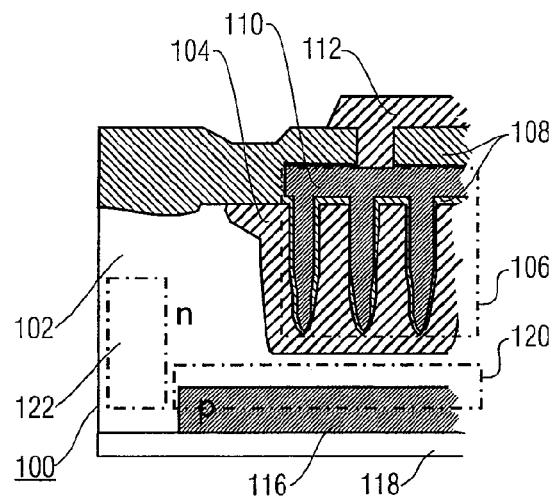
FIGS. 7a and 7b show schematic representations of further embodiments of an inventive snubber device.
Figure 7B:
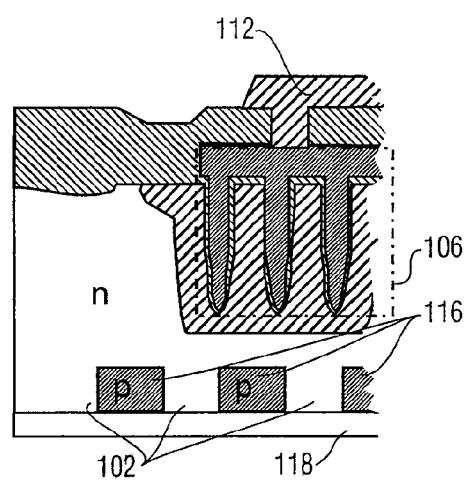
Figure 7C:
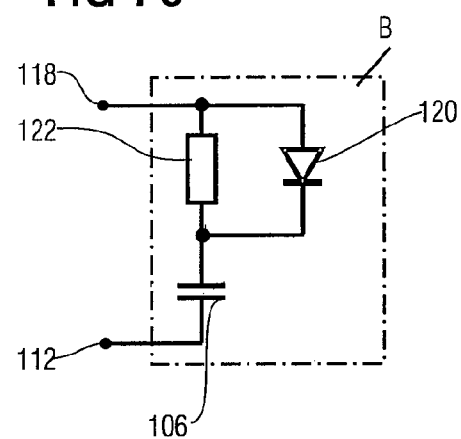
FIG. 7c shows a dV/dt limiter network implemented thereby.

FIG. 7a shows a cross-sectional view of a further inventive embodiment of an integrated snubber device implementing a dV/dt limiter network as is shown in FIG. 7c. The integrated snubber device comprises a semiconductor chip 100 having an n-doped semiconductor area 102 defined therein. The n-doped substrate area 102 comprises a semiconductor area 104 representing a bottom electrode of a capacitor structure 106. Capacitor structure 106 further comprises a dielectric layer 108 and a top electrode 110, the dielectric layer 108 being arranged between top electrode 110 and substrate area 104. Top electrode 110 is conductively connected to a first contact 112. A p-doped substrate area 116 is conductively connected to a second contact 118. A pn diode structure 120 is defined by the contact area between p-doped substrate area 116 and n-doped area 102. By means of the conductivity of n-doped substrate area 102, a resistor structure 122 is formed between terminal 118 and the bottom electrode of capacitor structure 104.

Figure 1A:
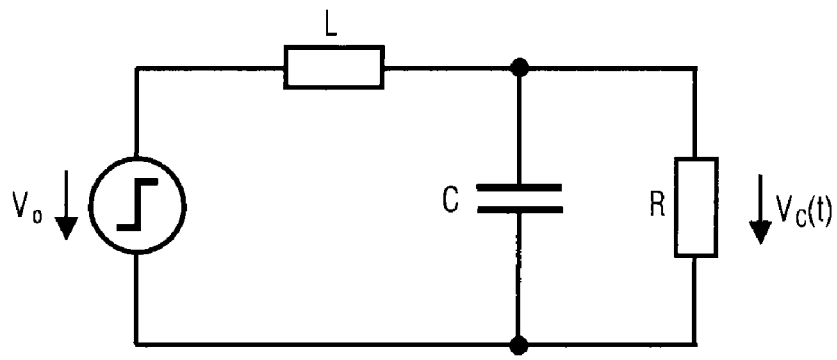
FIG. 1a is an example of a series resonant circuit consisting of elements L, C, and an attenuation resistor R.
Figure 1B:
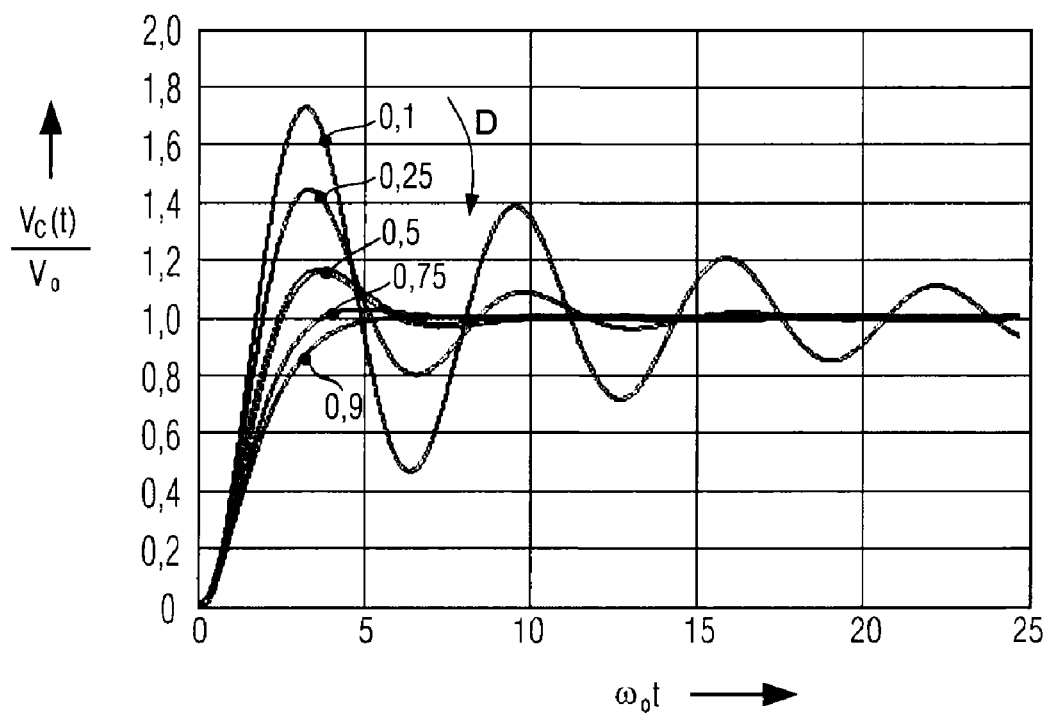
FIG. 1b shows step responses of the series resonant circuit for different attenuations.
Figure 2:
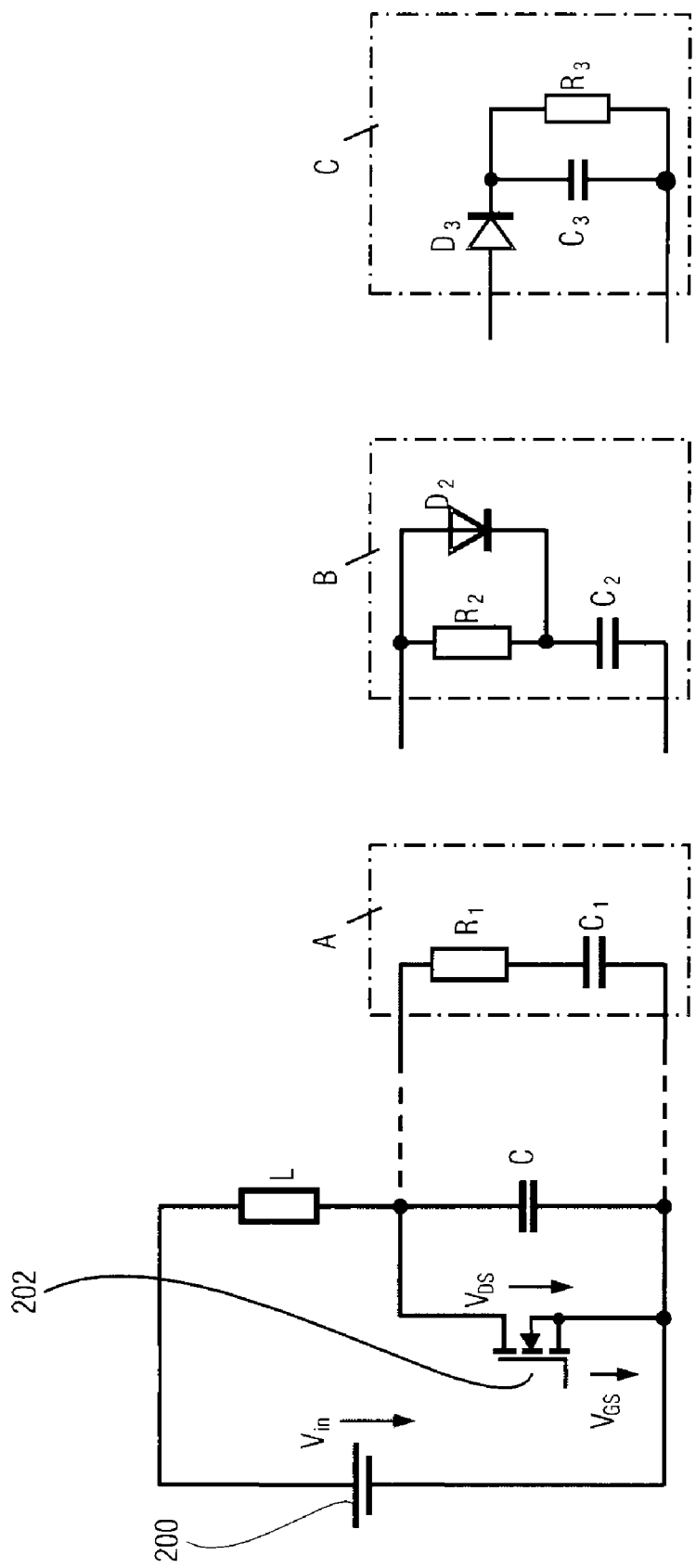
FIG. 2 depicts a network to be wired which comprises three possible snubber networks.

This embodiment realizes the snubber network B of FIG. 2. Here, the series connection of the capacitor and the resistor is realized, in technological terms, by analogy with the structure depicted and described in FIG. 4a. If the resistor is part of the substrate doping, it may be electrically demarcated, for example, using SOI substrate material and lateral isolation (e.g. trench isolation). By analogy therewith, these isolation possibilities may also be employed to electrically demarcate the diode from the other devices. For the technological implementation of the series connection of resistor and capacitor in accordance with the variant of FIG. 4a, the diode is realized as a vertical structure in parallel connection to resistor 122. This may be configured such that part of the substrate material of the contact area of the bottom electrode is doped with a dopant which re-dopes this area, i.e. provides it with a different conductivity than the substrate material (e.g. the substrate is n-conductive, the diode contact area is p-conductive, cf. FIG. 7a). The other part of the contact area is realized as a resistive contact. The two areas may be arranged, for example,—as is indicated in the embodiment of FIG. 7b—in the form of strip structures, as concentric circle structures, or as regularly or statistically arranged islands. By means of a suitable selection of the distance of the diode islands 116— which are p-doped in the example—a characteristic, which is deliberately non-linear, of the resistance may be achieved as a function of the diode reverse voltage. This is particularly advantageous since a high resistance present at the time of a negative voltage jump at the clamps of this network (112, 118) unloads the switch switching on (cf. FIG. 2), but since, at the same time, the resistance, which sharply decreases as the capacitor voltages decreases, leads to a short discharge time of the capacitor. In the application, the discharge time required restricts the minimum switch-on time of the switch (and thus the minimum duty cycle) and should therefore be as short as possible. In accordance with the prior art (linear (resistive) resistance), only inadequate compromises are possible between the switch-on loading and the discharge time.

If, in further embodiments of an inventive snubber device, electrical separation of the resistor and diode areas is required by the application, the areas may be demarcated by structuring the substrate (e.g. by deep anisotropic dry-etching processes). The structures may be configured such that either so-called vias, i.e. hole structures etched through the substrate, are coated, on the side walls, with an electric isolator and are filled, within the core, with a conductive material (e.g. doped polysilicon or metal), or they are structures which delimit the diode area and are filled with electrically isolating material.

Depending on the voltage requirement, the diode structures are pn junctions (for relatively small voltages of up to about 50 V) or pin diode structures (for higher voltages). As is common for power diodes, the dielectric strength of the pin diodes is effected across the width of the i zone (so-called intrinsic zone). This may be ensured by specifying the electrode distances in the mask design, or by depth diffusion and/or substrate thinning (case of FIG. 4a). The current-carrying ability of the diode structures is set across their active contact areas.

In a further embodiment, the diode structure may be connected in parallel with the resistor structure as a lateral diode, as in the case of the implementation of FIG. 3a. The resistor and the lateral diode may be electrically separated using isolation layers (e.g. silica or silicon nitride).

If the resistor is realized, in a further embodiment, as a conductive trace, an isolating layer is deposited on the substrate and is positioned between the substrate (diode) and the conductive trace.

Figure 8A:
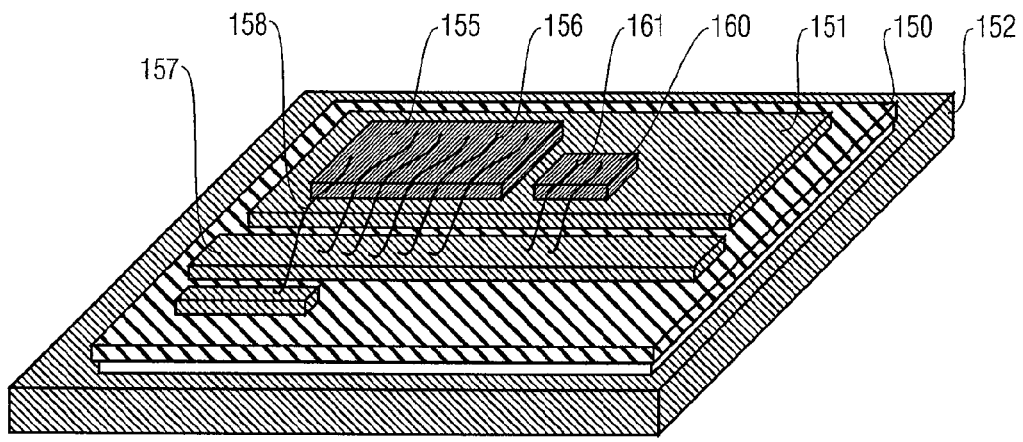
FIGS. 8a and 8b show schematic representations for illustrating possible applications of an inventive snubber device.

By way of example, FIG. 8a shows a possible application of an inventive snubber device. A ceramic substrate 150 mounted on a heat sink 152 has metallic conductor patterns (151, 157) on its surface which have one or several power semiconductor chips 155 mounted thereon. The chip 155 may be a diode or a controllable switch (e.g. an IGBT or a MOSFET comprising a control terminal 158). If chip 155 is a vertical MOSFET, then 151 will correspond to the drain terminal, and the source terminal will be contacted via the bonding wires 156 to the conductive trace 157. The snubber device 160 implements one of the topologies A, B or C of FIG. 2—or a different topology adjusted to the respective problem.

As has already been indicated in FIG. 2, the snubber devices are generally located immediately in parallel with the power semiconductors within a circuit (diodes or switches). In order to suppress oscillations as efficiently as possible, the connection between the power semiconductor and the snubber devices must be effected at as low an inductance as possible. Since a snubber device integrated in accordance with the invention is compatible, in terms of assembly techniques, with power semiconductors, low-inductance coupling to the power semiconductor and effective cooling are very easy to implement—unlike the possibilities offered by the prior art.

Since an inventive snubber device 160 exhibits, on the bottom face of the chip, precisely that electric terminal which needs to be electrically connected to the chip bottom face of the power semiconductor 155, the inventive snubber device may be mounted onto the same copper face 151 immediately adjacent to the power semiconductor chip 155. Contacting may then be effected in parallel with that of the power semiconductor, via bonding wires 161, to the conductive trace 157 which is connected to the top face of the power semiconductor.

Figure 8B:
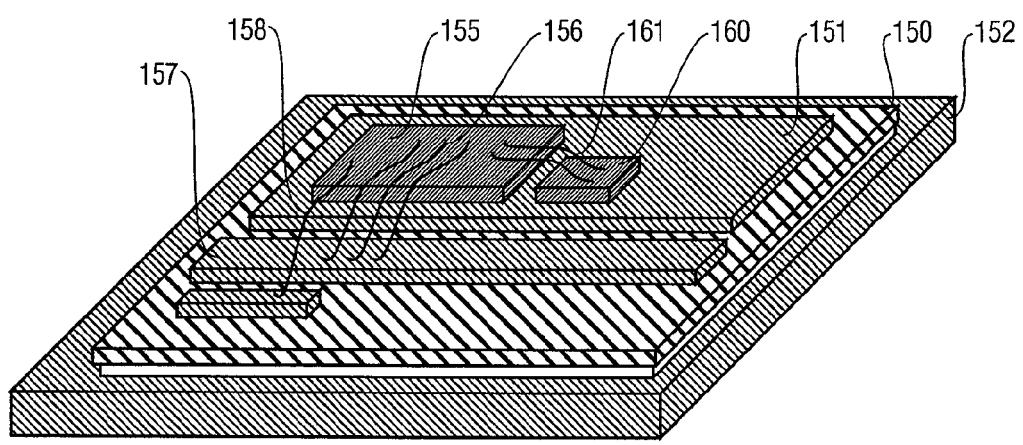

With power semiconductors which switch very quickly (MOSFET, Schottky diodes), or with very persistent and high-frequency oscillations, a further possible embodiment also allows direct contacting of the top face of the snubber device onto the top face of the power semiconductor, as is indicated in FIG. 8b.

Those skilled in the art know that top-face contacting is possible not only by means of wire bonding, but that in further embodiments, one may also employ metallic bails, ribbons or foils which may be conductively connected to the top face of the chip by means of soldering, adhesive bonding or sintering processes.

Figure 9:
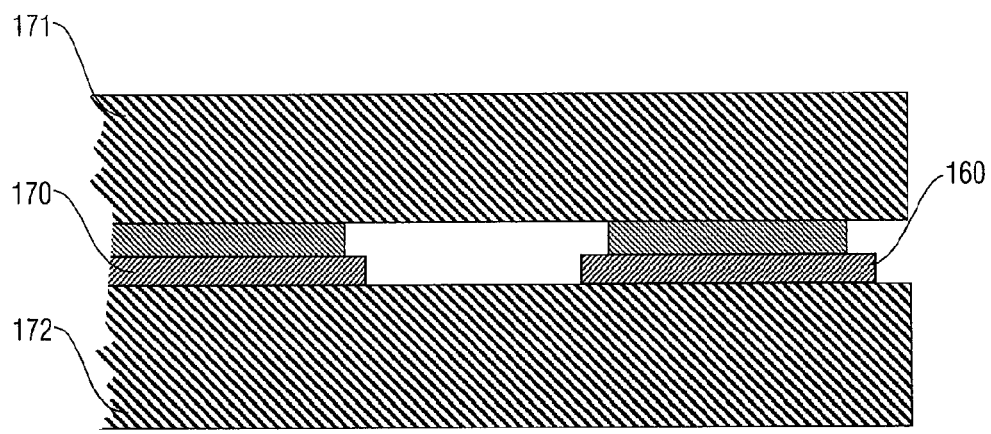
FIG. 9 is a schematic representation for illustrating an application of an inventive snubber device within a so-called presspack package.

FIG. 9 schematically shows a further possible application of an inventive snubber device, here in a so-called presspack housing. Such housings are employed for diodes, thyristors, GTOs or IGBTs in the high performance range and in the event of high demands being placed upon the change-of-load stability. With this type of housing, power semiconductor 170 is pressed between metallic electrodes 171 and 172 which contact the top and bottom faces of chip 170. An inventive snubber device 160 is fully compatible, in terms of assembly techniques, with power semiconductor 170, and may be pressed, along with same, between electrodes 171 and 172, and may be contacted accordingly. Thus, electrical and thermal performances may be achieved which have been unrivalled by present-day solutions.

Figure 10:
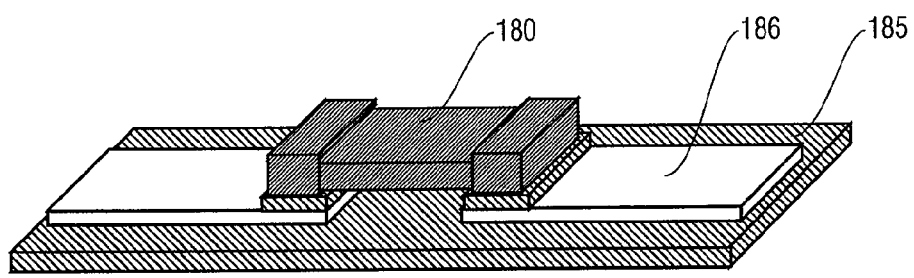
FIG. 10 is a possible embodiment of the inventive snubber device as a double-pole SMD device.

FIG. 10 shows a possible embodiment of the snubber device as a double-pole discrete SMD device 180, mounted on a circuit support 185 and contacted via electric conductive traces 186.

Those skilled in the art will immediately recognize that an inventive snubber device may also be housed as a discrete electronic device. What is advantageously contemplated for snubber devices having a high load capacity are housing designs with metallic cooling fins such as the D-Pak (TO-252), while extremely low-inductance housings (e.g. BGA or PLCC) are to be preferred for snubber devices effective up to very high frequency ranges.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated snubber device on a semiconductor basis for wiring an electric network for absorbing electric energy from an electric energy store of an electric network, comprising:
at least two terminals for connecting to the electric network to be wired, an electric resistor structure and a capacitor structure which are connected between the terminals, wherein the capacitor structure comprises a doped semiconductor substrate area forming a first electrode of the capacitor structure, the doped semiconductor substrate area having a dielectric layer arranged thereon which conformingly covers the semiconductor substrate area, and the dielectric layer having a conductive layer arranged thereon which forms a second electrode of the capacitor structure, and wherein an electric resistance of the resistor structure is adjusted via a specific conductivity of the semiconductor substrate area of the first electrode of the capacitor structure.

2. The integrated snubber device as claimed in claim 1, wherein the semiconductor substrate area, the dielectric layer, and the conductive layer are arranged in a planar manner.

3. The integrated snubber device as claimed in claim 1, wherein at least part of the semiconductor substrate area is provided, by means of structuring, with hole openings or trenches, the depths of which are larger than their diameters, or their widths.

4. The integrated snubber device as claimed in claim 1, wherein the first and second electrodes of the capacitor structure are each connected to one of the terminals for being connected to the electric network to be wired.

5. The integrated snubber device as claimed in claim 1, wherein the terminals to be connected to the electric network to be wired are all located on one side of the snubber device.

6. The integrated snubber device as claimed in claim 1, wherein the terminals to be connected to the electric network to be wired are located on different sides of the snubber device.

7. The integrated snubber device as claimed in claim 1, wherein the specific conductivity of the semiconductor substrate area of the first electrode of the capacitor structure is adjusted by means of doping the semiconductor substrate area of the first electrode of the capacitor structure.

8. The integrated snubber device as claimed in claim 1, wherein the snubber device contains at least one semiconductor structure comprising a non-linear current/voltage characteristic curve.

9. The integrated snubber device as claimed in claim 1, the snubber device containing at least one transistor structure.

10. The integrated snubber device as claimed in claim 1, the snubber device containing at least one inductive structure.

11. The integrated snubber device as claimed in claim 1, the snubber device being monolithically integrated into a chip.

12. The integrated snubber device as claimed in claim 1, the resistor structure and the capacitor structure being connected in series such that a first terminal is connected to an n-doped semiconductor substrate area forming a first electrode of the capacitor structure, the n-doped semiconductor substrate area having a dielectric layer arranged thereon which conformingly covers the semiconductor substrate area, and the dielectric layer having a conductive layer arranged thereon which forms a second electrode of the capacitor structure and is connected to a second terminal.

13. A use of an integrated snubber device on a semiconductor basis for wiring an electric network for absorbing electric energy from an electric energy store of an electric network, the device comprising:
at least two terminals for connecting to the electric network to be wired, an electric resistor structure and a capacitor structure which are connected between the terminals, wherein the capacitor structure comprises a doped semiconductor substrate area forming a first electrode of the capacitor structure, the doped semiconductor substrate area having a dielectric layer arranged thereon which conformingly covers the semiconductor substrate area, and the dielectric layer having a conductive layer arranged thereon which forms a second electrode of the capacitor structure, and wherein an electric resistance of the resistor structure is adjusted via a specific conductivity of the semiconductor substrate area of the first electrode of the capacitor structure;
for wiring an electric network for absorbing electric energy from an electric energy store of the electric network, to achieve switching load reduction, voltage limitation, and/or oscillation attenuation of the electric network.

* * * * *